(12) United States Patent
Spagnola et al.

(10) Patent No.: US 10,636,920 B2
(45) Date of Patent: Apr. 28, 2020

(54) BARRIER FILM, METHOD OF MAKING THE BARRIER FILM, AND ARTICLES INCLUDING THE BARRIER FILM

(71) Applicant: 3M INNOVATIVE PROPERTIES COMPANY, St. Paul, MN (US)

(72) Inventors: Joseph C. Spagnola, Woodbury, MN (US); Mark A. Roehrig, Stillwater, MN (US); Thomas P. Klun, Lakeland, MN (US); Alan K. Nachtigal, Minneapolis, MN (US); Jennifer K. Schnobrich, St. Paul, MN (US); Guy D. Joly, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 506 days.

(21) Appl. No.: 14/420,060

(22) PCT Filed: Aug. 8, 2013

(86) PCT No.: PCT/US2013/054106
§ 371 (c)(1),
(2) Date: Feb. 6, 2015

(87) PCT Pub. No.: WO2014/025983
PCT Pub. Date: Feb. 13, 2014

(65) Prior Publication Data
US 2015/0194541 A1  Jul. 9, 2015

Related U.S. Application Data

(60) Provisional application No. 61/680,955, filed on Aug. 8, 2012, provisional application No. 61/782,076, filed on Mar. 14, 2013.

(51) Int. Cl.
*H01L 31/0216* (2014.01)
*B32B 33/00* (2006.01)
(Continued)

(52) U.S. Cl.
CPC .......... *H01L 31/02167* (2013.01); *B05D 1/60* (2013.01); *B32B 7/12* (2013.01);
(Continued)

(58) Field of Classification Search
CPC .... B05D 7/04; B05D 7/56; B05D 1/60; B32B 2307/7244; B32B 2307/7246;
(Continued)

(56) References Cited

U.S. PATENT DOCUMENTS 3,775,226 A   11/1973   Windorf
4,696,719 A    9/1987   Bischoff
(Continued)

FOREIGN PATENT DOCUMENTS

EP   2093804   8/2009
JP   5131590   5/1993
(Continued)

OTHER PUBLICATIONS

How to Prepare Reproducible, Homogeneous, and Hydrolytically Stable Aminosilane-derived Layers on Silica, Jan. 10, 2012. (Year: 2012).*

(Continued)

*Primary Examiner* — Michael B Nelson

(57) ABSTRACT

A barrier film that includes a substrate, a first polymer layer on a major surface of the substrate, an oxide layer on the first polymer layer, and a second polymer layer on the oxide layer. At least one of the first or second polymer layers includes a siloxane reaction product of a secondary or tertiary amino-functional silane having at least two silane groups. A method of making the barrier film and articles and a barrier assembly including the barrier film are also disclosed.

13 Claims, 1 Drawing Sheet

(51) Int. Cl.

| | | |
|---|---|---|
| C08J 7/04 | (2020.01) | |
| B32B 27/08 | (2006.01) | |
| B32B 27/30 | (2006.01) | |
| B32B 7/12 | (2006.01) | |
| B32B 27/28 | (2006.01) | |
| B32B 27/36 | (2006.01) | |
| B05D 1/00 | (2006.01) | |
| C09D 183/04 | (2006.01) | |
| B05D 7/04 | (2006.01) | |
| B05D 7/00 | (2006.01) | |
| G02F 1/1333 | (2006.01) | |

(52) U.S. Cl.
CPC ............ *B32B 27/08* (2013.01); *B32B 27/281* (2013.01); *B32B 27/283* (2013.01); *B32B 27/286* (2013.01); *B32B 27/288* (2013.01); *B32B 27/30* (2013.01); *B32B 27/308* (2013.01); *B32B 27/36* (2013.01); *B32B 33/00* (2013.01); *C08J 7/045* (2013.01); *C09D 183/04* (2013.01); *B05D 7/04* (2013.01); *B05D 7/56* (2013.01); *B32B 2307/554* (2013.01); *B32B 2307/558* (2013.01); *B32B 2307/584* (2013.01); *B32B 2307/712* (2013.01); *B32B 2307/7244* (2013.01); *B32B 2307/7246* (2013.01); *B32B 2307/7248* (2013.01); *B32B 2457/00* (2013.01); *B32B 2457/12* (2013.01); *B32B 2457/20* (2013.01); *C08J 2367/02* (2013.01); *C08J 2433/14* (2013.01); *C08J 2483/04* (2013.01); *G02F 1/133305* (2013.01); *G02F 2001/133337* (2013.01); *Y10T 428/3154* (2015.04); *Y10T 428/31544* (2015.04); *Y10T 428/31547* (2015.04); *Y10T 428/31663* (2015.04)

(58) Field of Classification Search
CPC . B32B 2307/7248; B32B 27/30; B32B 33/00; B32B 2307/554; B32B 2307/558; B32B 2307/584; B32B 2307/712; B32B 2457/00; B32B 2457/12; B32B 2457/20; B32B 27/08; B32B 27/281; B32B 27/283; B32B 27/286; B32B 27/288; B32B 27/308; B32B 27/36; B32B 7/12; C08J 2367/02; C08J 2433/14; C08J 2483/04; C08J 7/045; C09D 183/04; G02F 1/133305; G02F 2001/133337; H01L 31/02167; Y10T 428/3154; Y10T 428/31544; Y10T 428/31547; Y10T 428/31663

See application file for complete search history.

(56) References Cited

U.S. PATENT DOCUMENTS

| | | |
|---|---|---|
| 4,722,515 A | 2/1988 | Ham |
| 4,842,893 A | 6/1989 | Yializis |
| 4,954,371 A | 9/1990 | Yializis |
| 5,018,048 A | 5/1991 | Shaw |
| 5,032,461 A | 7/1991 | Shaw |
| 5,097,800 A | 3/1992 | Shaw |
| 5,125,138 A | 6/1992 | Shaw |
| 5,440,446 A | 8/1995 | Shaw |
| 5,464,667 A | 11/1995 | Kohler |
| 5,540,978 A | 7/1996 | Schrenk |
| 5,547,908 A | 8/1996 | Furuzawa |
| 5,770,301 A | 6/1998 | Murai |
| 5,840,428 A | 11/1998 | Blizzard |
| 5,877,895 A | 3/1999 | Shaw |
| 6,010,751 A | 1/2000 | Shaw |
| 6,045,864 A | 4/2000 | Lyons |
| 6,214,422 B1 | 4/2001 | Yializis |
| 6,231,939 B1 | 5/2001 | Shaw |
| 6,348,237 B2 | 2/2002 | Kohler |
| 6,369,316 B1 | 4/2002 | Plessing |
| 6,413,645 B1 | 7/2002 | Graff |
| 6,686,008 B1 | 2/2004 | Merlin |
| 7,015,640 B2 | 3/2006 | Schaepkens |
| 7,018,713 B2 | 3/2006 | Padiyath |
| 7,077,935 B2 | 7/2006 | Ziegler |
| 7,323,514 B2 | 1/2008 | Jing |
| 8,628,859 B2 | 1/2014 | Weigel |
| 8,846,169 B2 | 9/2014 | McCormick |
| 9,254,506 B2 | 2/2016 | Roehrig |
| 2003/0029493 A1 | 2/2003 | Plessing |
| 2004/0031977 A1 | 2/2004 | Brown |
| 2004/0077892 A1 | 4/2004 | Arkles |
| 2004/0253428 A1 | 12/2004 | Wang |
| 2006/0058451 A1 | 3/2006 | Gommans |
| 2007/0020451 A1 | 1/2007 | Padiyath |
| 2007/0099004 A1 | 5/2007 | Edelmann |
| 2007/0141365 A1 | 6/2007 | Jelle |
| 2007/0154718 A1 | 7/2007 | Silverman |
| 2007/0287277 A1 | 12/2007 | Kolics |
| 2008/0196664 A1 | 8/2008 | David |
| 2009/0130463 A1 | 5/2009 | Albaugh |
| 2011/0064947 A1 | 3/2011 | Aiba |
| 2011/0117347 A1 | 5/2011 | Larson |
| 2011/0287233 A1 | 11/2011 | Ma |
| 2012/0003448 A1* | 1/2012 | Weigel .............. B32B 17/10018 428/212 |
| 2012/0003451 A1 | 1/2012 | Weigel |
| 2012/0003484 A1 | 1/2012 | Roehrig |
| 2012/0114931 A1 | 5/2012 | Siche |
| 2012/0227809 A1 | 9/2012 | Bharti |
| 2013/0302627 A1* | 11/2013 | Roehrig ................ B32B 27/308 428/447 |
| 2013/0323519 A1* | 12/2013 | Klun ..................... H01L 23/296 428/447 |

FOREIGN PATENT DOCUMENTS

| | | |
|---|---|---|
| JP | 9132767 | 5/1997 |
| JP | 2002-188038 | 7/2002 |
| JP | 2005-169696 | 6/2005 |
| JP | 2007-261020 | 10/2007 |
| JP | 2008-80704 | 8/2008 |
| JP | 2010-005817 | 1/2010 |
| WO | WO 2000-26973 | 5/2000 |
| WO | WO 01/66653 | 9/2001 |
| WO | WO 01/66654 | 9/2001 |
| WO | WO 01/66657 | 9/2001 |
| WO | WO 01/66661 | 9/2001 |
| WO | WO 01/66662 | 9/2001 |
| WO | WO 2003-093352 | 11/2003 |
| WO | WO 2010-064491 | 6/2010 |
| WO | WO 2011-113008 | 9/2011 |

OTHER PUBLICATIONS

Gelest Silane Coupling Agents: Connecting Across Boundaries, 2006 (Year: 2006).*

Affinito, "Polymer-Oxide Transparent Barrier Layers", Society of Vacuum Coaters 39$^{th}$ Annual Technical Conference Proceedings, 1996, pp. 392-397.

Affinito, "Vacuum deposited polymer/metal multilayer films for optical application", Thin Solid Films, 1995, vol. 270, pp. 43-48.

Santas, "Handbook of Pressure Sensitive Adhesive Technology", 2$^{nd}$ Edition, 172 (1989).

Shaw, "A New Vapor Deposition Process for Coating Paper and Polymer Webs", Technical paper Presented at The Sixth International Vacuum Web Coating Conference in Reno, Oct. 1992, pp. 18-24.

Shaw, "Use of Vapor Deposited Acrylate Coatings to Improve the Barrier Properties of Metallized Film", Society of Vacuum Coaters 37th Annual Technical Conference Proceedings, May 1994, pp. 240-247.

(56) References Cited

OTHER PUBLICATIONS

Shaw, "A New High Speed Process for Vapor Depositing Acrylate Thin Films: An Update", Society of Vacuum Coaters 36th Annual Technical Conference Proceedings, Apr. 1993; pp. 348-352.
Shaw, "Use of Evaporated Acrylate Coatings to Smooth the Surface of Polyester and Polypropylene Film Substrates", RadTec' 96 North America UV/EB Conference Proceedings, 1996, pp. 701-707.
Swanson, "Measurement of Web Curl", Applied Web Handling Conference, 2006, 10 pages.
International Search Report for PCT International Application No. PCT/US2013/054106, dated Oct. 28, 2013, 5pgs.
Intellectual Property Office of Singapore Search Report, Application No. 11201500948R, dated Feb. 11, 2015.

* cited by examiner

BARRIER FILM, METHOD OF MAKING THE BARRIER FILM, AND ARTICLES INCLUDING THE BARRIER FILM

CROSS REFERENCE TO RELATED APPLICATIONS

This application is a national stage filing under 35 U.S.C. 371 of PCT/US2013/054106, filed Aug. 8, 2013, which claims priority to U.S. Provisional Application Nos. 61/680,955, filed Aug. 8, 2012, and 61/782,076, filed Mar. 14, 2013, the disclosures of which are incorporated by reference in their entirety herein.

STATEMENT REGARDING FEDERALLY SPONSORED RESEARCH OR DEVELOPMENT

This invention was made with government support under contract number DE-EE0004739 awarded by the Department of Energy. The Government has certain rights in this invention.

BACKGROUND

Inorganic or hybrid inorganic/organic layers have been used in thin films for electrical, packaging and decorative applications. These layers can provide desired properties such as mechanical strength, thermal resistance, chemical resistance, abrasion resistance, moisture barriers, and oxygen barriers. Highly transparent multilayer barrier coatings have also been developed to protect sensitive materials from damage due to water vapor. The moisture sensitive materials can be electronic components such as organic, inorganic, and hybrid organic/inorganic semiconductor devices. The multilayer barrier coatings can be deposited directly on the moisture sensitive material, or can be deposited on a flexible transparent substrate such as a polymer film.

Multilayer barrier coatings can be prepared by a variety of production methods. These methods include liquid coating techniques such as solution coating, roll coating, dip coating, spray coating, spin coating; and dry coating techniques such as Chemical Vapor Deposition (CVD), Plasma Enhanced Chemical Vapor Deposition (PECVD), sputtering and vacuum processes for thermal evaporation of solid materials. One approach for multilayer barrier coatings has been to produce multilayer oxide coatings, such as aluminum oxide or silicon oxide, interspersed with thin polymer film protective layers. Each oxide/polymer film pair is often referred to as a "dyad", and the alternating oxide/polymer multilayer construction can contain several dyads to provide adequate protection from moisture and oxygen. Examples of such transparent multilayer barrier coatings and processes can be found, for example, in U.S. Pat. No. 5,440,446 (Shaw et al.); U.S. Pat. No. 5,877,895 (Shaw et al.); U.S. Pat. No. 6,010,751 (Shaw et al.); U.S. Pat. No. 7,018,713 (Padiyath et al.); and U.S. Pat. No. 6,413,645 (Graff et al.).

SUMMARY

The present disclosure describes a barrier film that includes a siloxane reaction product of a secondary or tertiary amino-functional silane having at least two silane groups. The barrier film is a multi-layer film demonstrated herein to have remarkable adhesion between layers after aging for 1000 hours at 85° C. and 85% relative humidity. The barrier film can be useful in a number of applications in the display, lighting, and electronic device markets as a relatively flexible replacement for glass to prevent the ingress of water vapor or other gases. The barrier film may provide advantages over glass since it is relatively more flexible, lighter-weight, and can be manufactured by continuous, roll-to-roll processing.

In one aspect, the present disclosure provides a barrier film comprising a substrate, a first polymer layer on a major surface of the substrate, an oxide layer on the first polymer layer, and a second polymer layer on the oxide layer, wherein at least one of the first or second polymer layers comprises a siloxane reaction product of a secondary or tertiary amino-functional silane having at least two silane groups, wherein the secondary or tertiary amino-functional silane is other than bis-(gamma-triethoxysilylpropyl)amine.

In another aspect, the disclosure describes a method of making a barrier film, the method comprising providing a first polymer layer to a surface of a substrate, providing an oxide layer on the first polymer layer, and providing a second polymer layer on the oxide layer, wherein at least one of the first or second polymer layers comprises a siloxane reaction product of a secondary or tertiary amino-functional silane having at least two silane groups, wherein the secondary or tertiary amino-functional silane is other than bis-(gamma-triethoxysilylpropyl)amine.

In a further aspect, the disclosure describes an article incorporating a barrier film according to and/or made according to the foregoing aspects, wherein the article is selected from a solid state lighting device, a display device, and combinations thereof.

In another aspect, the present disclosure provides a barrier assembly comprising the barrier film according to and/or made according to the foregoing aspects, wherein a major surface of the barrier film is adhered to a top sheet with a pressure sensitive adhesive.

In this application:

Terms such as "a", "an" and "the" are not intended to refer to only a singular entity, but include the general class of which a specific example may be used for illustration. The terms "a", "an", and "the" are used interchangeably with the term "at least one".

The phrase "comprises at least one of" followed by a list refers to comprising any one of the items in the list and any combination of two or more items in the list. The phrase "at least one of" followed by a list refers to any one of the items in the list or any combination of two or more items in the list.

"Alkyl group" and the prefix "alk-" are inclusive of both straight chain and branched chain groups and of cyclic groups. Unless otherwise specified, alkyl groups herein have up to 20 carbon atoms. Cyclic groups can be monocyclic or polycyclic and, in some embodiments, have from 3 to 10 ring carbon atoms. "Alkylene" is the divalent or multivalent form of "alkyl".

The phrase "interrupted by at least one functional group", for example, with regard to an alkyl, alkylene, or arylalkylene refers to having part of the alkyl, alkylene, or arylalkylene on both sides of the functional group. An example of an alkylene that is interrupted with —O— is —CH$_2$—CH$_2$—O—CH$_2$—CH$_2$—.

The term "aryl" as used herein includes carbocyclic aromatic rings or ring systems, for example, having 1, 2, or 3 rings, optionally containing at least one heteroatom (e.g., O, S, or N) in the ring, and optionally substituted by up to five substituents including one or more alkyl groups having up to 4 carbon atoms (e.g., methyl or ethyl), alkoxy having up to 4 carbon atoms, halo (i.e., fluoro, chloro, bromo or iodo), hydroxy, or nitro groups. Examples of aryl groups include phenyl, naphthyl, biphenyl, fluorenyl as well as furyl, thienyl, oxazolyl, and thiazolyl. "Arylalkylene" refers to an "alkylene" moiety to which an aryl group is attached.

By using words of orientation such as "atop", "on", "covering", "uppermost", "underlying" and the like for the location of various elements in the disclosed coated articles, we refer to the relative position of an element with respect to a horizontally-disposed, upwardly-facing substrate. It is not intended that the substrate or articles should have any particular orientation in space during or after manufacture.

The term "barrier film" or "barrier layer" refers to a film or layer which is designed to be impervious to vapor, gas or aroma migration. Examples of gases and vapors that may be excluded include oxygen and/or water vapor.

The term "polymer" includes homopolymers and copolymers, as well as homopolymers or copolymers that may be formed in a miscible blend, e.g., by coextrusion or by reaction, including, e.g., transesterification. Copolymers include both random and block copolymers.

The term "cure" refers to a process that causes a chemical change, e.g., a reaction via consumption of water, to solidify a film layer or increase its viscosity.

The term "crosslinked" polymer refers to a polymer whose polymer chains are joined together by covalent chemical bonds, usually via crosslinking molecules or groups, to form a network polymer. A crosslinked polymer is generally characterized by insolubility, but may be swellable in the presence of an appropriate solvent.

All numerical ranges are inclusive of their endpoints and nonintegral values between the endpoints unless otherwise stated.

Various aspects and advantages of embodiments of the present disclosure have been summarized. The above Summary is not intended to describe each illustrated embodiment or every implementation of the present invention. Further features and advantages are disclosed in the embodiments that follow. The Drawings and the Detailed Description that follow more particularly exemplify some embodiments using the principles disclosed herein.

BRIEF DESCRIPTION OF THE DRAWINGS

The accompanying drawings are incorporated in and constitute a part of this specification and, together with the description, explain some embodiments of the present disclosure.

Like reference numerals in the drawings indicate like elements. The drawings herein are not drawn to scale, and in the drawings, the illustrated elements are sized to emphasize selected features.

DETAILED DESCRIPTION

Figure 1:
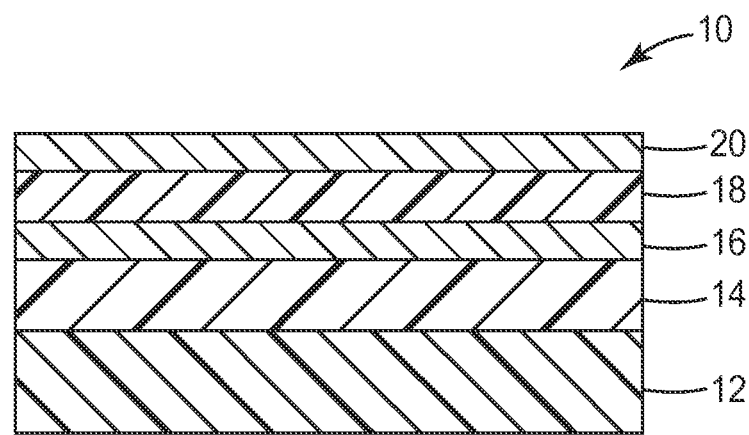
FIG. 1 is a diagram illustrating an embodiment of a moisture-resistant barrier film having a vapor-deposited adhesion-promoting coating according to an embodiment of the present disclosure.

Various embodiments of the disclosure will now be described with particular reference to the Drawings. Embodiments of the present disclosure may take on various modifications and alterations without departing from the spirit and scope of the disclosure. Accordingly, it is to be understood that the embodiments of the present disclosure are not to be limited to the following described embodiments, but are to be controlled by the limitations set forth in the claims and any equivalents thereof.

Several methods may be useful for producing oxide layers in a multilayer barrier film or coating as described above. Each of these methods provides unique challenges. In some cases, adhesion between layers in a multilayer barrier film is insufficient for a desired application. For example, polymer layers (e.g., an acrylate or methacrylate layer) may not have good adhesion to barrier oxide layers. In a sputter process for forming oxide layers, the deposition energy useful for forming a barrier oxide layer is generally high. In contrast, the energy involved in depositing polymer layers is generally low, and this difference in deposition energy may lead to adhesion problems. To increase adhesion between layers, particularly initial adhesion, an inorganic "tie" layer has been used. The inorganic tie layer typically includes elements such as chromium, zirconium, titanium, silicon and the like, which are often sputter deposited as a mono- or thin-layer of the material either as the element or in the presence of small amount of oxygen. The inorganic tie layer element can then form chemical bonds to both the oxide layer and the polymer layer. The process used to deposit inorganic tie layers often requires fine tuning to achieve the right layer concentration of tie layer atoms. The deposition can be affected by slight variations in the vacuum coating process such as fluctuation in vacuum pressure, out-gassing, and cross contamination from other processes resulting in variation of adhesion levels in the product. In addition, inorganic tie layers may not retain their initial adhesion levels after exposure to water vapor.

A more robust solution for adhesion improvement in barrier films is desirable. It is further desirable that the multi-layer construction in a multi-layer barrier film maintains or even improves upon initial adhesion levels when aged in 85° C. and 85% relative humidity Amino-functional silanes have been added to polymer layers to effectively improve adhesion between inorganic oxide layers and polymer layers in a multi-layer barrier film. Cyclic aza silanes have shown improved adhesion even up to 250 hours of aging at 85° C. and 85% relative humidity. See U.S. Pat. App. Pub. Nos. 2012-0003451 (Weigel et al.) and 2012-0003484 (Roehrig et al.). However, some applications have even more demanding requirements Amino-functional silanes useful for preparing the barrier films disclosed herein are demonstrated to provide unexpectedly better adhesion retention. Barrier films according to the present disclosure remarkably maintain adhesion and resist delamination after aging for 1000 hours at 85° C. and 85% relative humidity. In some embodiments, barrier films according to the present disclosure remarkably and advantageously have a peel adhesion greater than 4.0 N/cm after 1000 hours at 85° C. and 85% relative humidity with evaluated according to the T-peel method described below.

Thus, the present disclosure provides a barrier film including a substrate, a first polymer layer on a major surface of the substrate, an oxide layer on the first polymer layer, and a second polymer layer on the oxide layer, wherein at least one of the first or second polymer layers comprises a siloxane reaction product of a secondary or tertiary amino-functional silane having at least two silane groups. In some embodiments, an inorganic layer, which may be an oxide layer, can be applied over the second polymer layer. In some embodiments, the barrier film comprises a plurality of alternating layers of the oxide layer and the second polymer layer on the first polymer layer. The oxide layer and second polymer layer together form a "dyad", and in some embodiments, the barrier film can include more than one dyad. Each of the oxide layers and/or second polymer layers in the multilayer barrier film including more than one dyad can be the same or different. An optional inorganic layer, which may be an oxide layer, can be applied over the plurality of alternating layers or dyads. In some embodiments, inorganic layers comprise at least one of silicon aluminum oxide or indium tin oxide.

Turning now to the drawings, FIG. 1 is a diagram of an embodiment of a barrier film 10 including a single dyad. Film 10 includes layers arranged in the following order: a substrate 12; a first polymer layer 14; an oxide layer 16; a second polymer layer 18; and an optional oxide layer 20. Oxide layer 16 and second polymer layer 18 together form a dyad and, although only one dyad is shown, film 10 can include additional dyads of alternating oxide layer 16 and second polymer layer 18 between substrate 12 and the uppermost dyad.

The siloxane reaction product in at least one of the first or second polymer layers 14 or 18 can form from the reaction of a hydroxyl group on an oxide surface with a silane group on an amino-functional silane. The amount of water vapor present in a multi-process vacuum chamber, for example, can be controlled to promote the formation of such hydroxyl groups at useful surface concentrations to provide bonding sites. With residual gas monitoring and the use of water vapor sources, for example, the amount of water vapor in a vacuum chamber can be controlled to ensure generation of hydroxyl (e.g., Si—OH) groups. The siloxane reaction product can also form from the condensation of silane groups in two amino-functional silanes present. In such cases, a hydroxyl group (e.g., Si—OH) formed by hydrolysis of the amino-functional silane can react with silane group on another amino-functional silane.

The secondary or tertiary amino-functional silane useful for practicing the present disclosure has at least two independently selected silane groups $Si(Y)_p(R)_{3-p}$, wherein Y is a hydrolysable group such as those described below in connection with formulas I and II, R is a non-hydrolysable group such as alkyl or arylalkylenyl, either of which may be substituted, and p is 1, 2, or 3. In the amino-functional silane, the amino group is typically bonded to a carbon atom. The secondary or tertiary amino-functional silane may have one, two, three, or four secondary or tertiary amino groups. The silane groups are independently selected, which means that the two or more silane groups in the amino-functional silane may be the same or different. When the two or more silane groups are independently selected, it should be understood that the Y and R groups and the number of Y groups may be independently selected.

In some embodiments, the secondary or tertiary amino-functional silane useful for practicing the present disclosure is represented by formula I: $(R^3)_2N—R^1—[Si(Y)_p(R^2)_{3-p}]$. In some embodiments, the secondary or tertiary amino-functional silane useful for practicing the present disclosure is represented by formula II: $(R^3)_2N—R^1—[Si(Y)_p(R^2)_{3-p}]_q$. In formulas I and II, $R^1$ is a multivalent alkylene group optionally interrupted by one or more —O— groups or up to three —NR$^3$— groups. In some embodiments, $R^1$ is interrupted by up to three —O— groups. In embodiments in which $R^1$ is interrupted by up to three —NR$^3$— groups, the secondary or tertiary amino-functional silane includes diamino-functional silanes, triamino-functional silanes, and tetraamino-functional silanes, for example. In some embodiments, $R^1$ is a divalent alkylene group. In some embodiments, $R^1$ is a divalent alkylene group having up to 6 (in some embodiments, 5, 4, or 3) carbon atoms. In some embodiments, $R^1$ is a multivalent alkylene group interrupted by one or two —NR$^3$— groups and is represented by formula —CH$_2$—CH$_2$—N(R$^3$)—CH$_2$—CH$_2$—CH$_2$— or —CH$_2$—CH$_2$—N(R$^3$)—CH$_2$—CH$_2$—N(R$^3$)—CH$_2$—CH$_2$—CH$_2$—.

In formulas I and II, $R^2$ is alkyl, arylalkylenyl, or —R$^1$—[Si(Y)$_p$(R$^2$)$_{3-p}$], where $R^1$ is defined as in any of its above embodiments. In some embodiments, including any of the embodiments of $R^1$ as defined above, $R^2$ is alkyl or arylalkylenyl. In some of these embodiments, $R^2$ is alkyl (e.g., methyl or ethyl).

In formulas I and II, each $R^3$ is independently hydrogen, alkyl, arylalkylenyl, or —R$^1$—[Si(Y)$_p$(R$^2$)$_{3-p}$], where $R^1$ is defined as in any of the above embodiments, with the proviso that both $R^3$ groups may not be hydrogen. In some embodiments, one $R^3$ group is hydrogen or alkyl, and the other $R^3$ group is —R$^1$—[Si(Y)$_p$(R$^2$)$_{3-p}$]. In some of these embodiments, one $R^3$ group is alkyl, and the other $R^3$ group is —R$^1$—[Si(Y)$_p$(R$^2$)$_{3-p}$]. In some of these embodiments, alkyl may have up to 6 (in some embodiments, up to 5, 4, 3, or 2) carbon atoms. In some embodiments, one $R^3$ group is hydrogen or methyl, and the other $R^3$ group is —R$^1$—[Si(Y)$_p$(R$^2$)$_{3-p}$]. In some of these embodiments, one $R^3$ group is hydrogen, and the other $R^3$ group is —R$^1$—[Si(Y)$_p$(R$^2$)$_{3-p}$]. $R^1$, $R^2$, and $R^3$ are selected such that at least two independently selected —Si(Y)$_p$(R$^2$)$_{3-p}$ groups are present in the compound represented by formula II.

In formulas I and II, Y is alkoxy, acetoxy, aryloxy, or halogen. In some embodiments, including any of the embodiments described above for $R^1$, $R^2$, or $R^3$, Y is methoxy, acetoxy, phenoxy, bromo, or chloro. In some embodiments, including any of the embodiments described above for $R^1$, $R^2$, or $R^3$, Y is other than ethoxy. In some embodiments, including any of the embodiments described above for $R^1$, $R^2$, or $R^3$, Y is methoxy, acetoxy, or chloro. Methoxy groups on a silane provide low steric hindrance and are readily hydrolyzed to effectively allow for formation of an —Si—O—Si— bond. Acetoxy and chloro groups on a silane are also readily hydrolyzed for at least the same reason and therefore are expected to be as effective or even more effective than methoxy groups in allowing formation of an —Si—O—Si— bond.

In formulas I and II, p is 1, 2, or 3. In some embodiments, including any of the embodiments described above for $R^1$, $R^2$, $R^3$, or Y, p is 3.

In formula II, q is 1, 2, or 3. In some embodiments of formula II, q is 1. In these embodiments, $R^1$ is a divalent alkylene group. In some embodiments of formula II, $R^1$ is a multivalent alkylene group, and q is 2 or 3.

Examples of second or tertiary amino-functional silane compounds useful for practicing the present disclosure include bis(3-trimethoxysilylpropyl)amine, N-methyl-bis(3-trimethoxysilylpropyl)amine, and N,N'-bis[3-trimethoxysilylpropyl]-ethylenediamine.

As described in further detail below, the first and second polymer layers may be applied by vapor-deposition. In these embodiments, it is desirable that the first and/or second polymer layers comprising the amino-functional silanes be pumpable (e.g., be liquid-phase with an acceptable viscosity); capable of being atomized (that is, forming small droplets of liquid); capable of being flash evaporated (e.g., having a high enough vapor pressure); condensable; and capable of being cross-linked in vacuum. Further, in these embodiments, the molecular weight of the secondary or tertiary amino-functional silane is in the range where sufficient vapor pressure at vacuum process conditions is effective to carry out evaporation and subsequent condensation to a thin liquid film. In some embodiments, the molecular weight is up to about 2,000 Da, 1,000 Da, or, in some embodiments, 500 Da.

In some embodiments, the siloxane reaction product of the secondary or tertiary amino-functional silane is present at up to 20% by weight (% wt.) of the first and/or second polymer layer; in some embodiments, up to 19%, 18%, 17%, 16%, 15%, 14%, 13%, 12%, 11%, 10%, 9%, 8%, 7%, 6%, 5%, 4%, 3%, 2% or even 1% wt. of the first and/or second polymer layer, based on the total weight of the first and/or second polymer layer. In some embodiments, the first and/or second polymer layer that comprises the siloxane reaction product may be rich in the siloxane reaction product (e.g., include more than 50% of the siloxane reaction product) or comprise only the siloxane reaction product. In some of these embodiments, an additional polymer layer may be present on the second polymer layer.

In some embodiments, barrier films according to the present disclosure are transmissive to both visible and infrared light. The term "transmissive to visible and infrared light" as used herein can mean having an average transmission over the visible and infrared portion of the spectrum of at least about 75% (in some embodiments at least about 80, 85, 90, 92, 95, 97, or 98%) measured along the normal axis. In some embodiments, the visible and infrared light-transmissive assembly has an average transmission over a range of 400 nm to 1400 nm of at least about 75% (in some embodiments at least about 80, 85, 90, 92, 95, 97, or 98%). Visible and infrared light-transmissive assemblies are those that do not interfere with absorption of visible and infrared light, for example, by photovoltaic cells. In some embodiments, the visible and infrared light-transmissive assembly has an average transmission over a range wavelengths of light that are useful to a photovoltaic cell of at least about 75% (in some embodiments at least about 80, 85, 90, 92, 95, 97, or 98%).

In some embodiments, barrier films according to the present disclosure are flexible. The term "flexible" as used herein refers to being capable of being formed into a roll. In some embodiments, the term "flexible" refers to being capable of being bent around a roll core with a radius of curvature of up to 7.6 centimeters (cm) (3 inches), in some embodiments up to 6.4 cm (2.5 inches), 5 cm (2 inches), 3.8 cm (1.5 inch), or 2.5 cm (1 inch). In some embodiments, the barrier film can be bent around a radius of curvature of at least 0.635 cm (¼ inch), 1.3 cm (½ inch) or 1.9 cm (¾ inch).

Referring again to FIG. 1, a variety of useful materials can be selected for substrate 12. In some embodiments, the substrate can be selected based on refractive index and thickness to enhance transmission to visible and infrared light. In some embodiments, the substrate can be selected to be flexible, as defined above.

Examples of useful substrates include thermoplastic polymeric films including, for example, polyesters, polyacrylates (e.g., polymethyl methacrylate), polycarbonates, polypropylenes, high or low density polyethylenes, polysulfones, polyether sulfones, polyurethanes, polyamides, polyvinyl butyral, polyvinyl chloride, fluoropolymers (e.g., polyvinylidene difluoride and polytetrafluoroethylene), polyethylene sulfide, olefinic copolymers such copolymers of ethylene and norbornene (e.g., available as "TOPAS COC" from Topas Advanced Polymers of Florence, Ky.), and thermoset films such as epoxies, cellulose derivatives, polyimide, polyimide benzoxazole, and polybenzoxazole.

In some embodiments, the substrate comprises at least one of polyethylene terephthalate, polyethylene naphthalate, polyetheretherketone, polyaryletherketone, polyacrylate, polyetherimide, polyarylsulfone, polyethersulfone, polyamideimide, polyimide, ethylene-tetrafluoroethylene copolymer, tetrafluoroethylene-hexafluoropropylene copolymer, tetrafluoroethylene-hexafluoropropylene-vinylidene fluoride copolymer, or polyvinylidene fluoride, any of which may optionally be heat-stabilized.

In some embodiments, the substrate comprises at least one of polyethylene terephthalate (PET), polyethylene napthalate (PEN), heat stabilized PET, heat stabilized PEN, polyoxymethylene, polyvinylnaphthalene, polyetheretherketone, fluoropolymer, polycarbonate, polymethylmethacrylate, poly α-methyl styrene, polysulfone, polyphenylene oxide, polyetherimide, polyethersulfone, polyamideimide, polyimide, or polyphthalamide. In some embodiments, the substrate includes PET.

Heat-stabilization of the substrate may be carried out, for example, using heat setting, annealing under tension, or other techniques that will discourage shrinkage up to at least the heat stabilization temperature when the polymeric film is not constrained.

In some embodiments, the substrate is a multilayer optical film ("MOF"), such as those described in U.S. Pat. App. Pub. No. 2012-0003451 (Weigel et al.).

The substrate may have a variety of thicknesses, for example, about 0.01 millimeters (mm) to about 1 mm. The substrate may however be considerably thicker, for example, when a self-supporting article is desired. Such articles can conveniently also be made by laminating or otherwise joining a disclosed film made using a flexible substrate to a thicker, inflexible, or less flexible supplemental support.

Returning to FIG. 1, the first and second polymer layers 14 and 18 can include any polymer suitable for deposition in a thin film. In some embodiments, the first and second polymer layer 14 and 18 can be formed from various precursors, for example, acrylate or methacrylate monomers and/or oligomers that include acrylates or methacrylates. In some embodiments of the barrier film and the method disclosed herein, at least one of the first or second polymer layer precursor comprises a methacrylate or acrylate monomer. Examples of useful methacrylate and acrylate precursors include urethane acrylates, isobornyl acrylate, isobornyl methacrylate, dipentaerythritol pentaacrylates, epoxy acrylates, epoxy acrylates blended with styrene, di-trimethylolpropane tetraacrylates, diethylene glycol diacrylates, 1,3-butylene glycol diacrylate, pentaacrylate esters, pentaerythritol tetraacrylates, pentaerythritol triacrylates, ethoxylated (3) trimethylolpropane triacrylates, ethoxylated (3) trimethylolpropane triacrylates, alkoxylated trifunctional acrylate esters, dipropylene glycol diacrylates, neopentyl glycol diacrylates, ethoxylated (4) bisphenol A dimethacrylates, cyclohexane dimethanol diacrylate esters, isobornyl methacrylate, cyclic diacrylates and tris (2-hydroxy ethyl) isocyanurate triacrylate, acrylates of the foregoing methacrylates and methacrylates of the foregoing acrylates. Further examples of useful acrylate or methacrylate precursors include trimethylolpropane triacrylate, trimethylolpropane diacrylate, hexanediol diacrylate, ethoxyethyl acrylate, phenoxyethyl acrylate, cyanoethyl (mono)acrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2,2,2-trifluoromethyl acrylate, and methacrylates of any of these acrylates.

The first and second polymer layers 14 and 18 can be formed by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the substrate.

The monomer or oligomer can also be applied to the substrate 12 using conventional coating methods such as roll coating (e.g., gravure roll coating) or spray coating (e.g., electrostatic spray coating), then crosslinked as set out above. The first and second polymer layers 14 and 18 can also be formed by applying a layer containing an oligomer or polymer in solvent and drying the thus-applied layer to remove the solvent. Chemical Vapor Deposition (CVD) may also be employed in some cases.

In some embodiments of the barrier film disclosed herein, at least one of the first or second polymer layers comprises a polymerized (e.g., cross-linked) acrylate or methacrylate. In some of these embodiments, the acrylate or methacrylate is tricyclodecanedimethanol diacrylate, 3-(acryloxy)-2-hydroxy-propylmethacrylate, triacryloxyethyl isocyanurate, glycerol diacrylate, ethoxylated trimethylolpropane diacrylate, pentaerythritol triacrylate, pentaerythritol tetraacrylate, propoxylated (3) glyceryl diacrylate, propoxylated (5,5) glyceryl diacrylate, propoxylated (3) trimethylolpropane diacrylate, propoxylated (6) trimethylolpropane diacrylate), trimethylolpropane diacrylate, trimethylolpropane triacrylate, di-trimethylolpropane tetraacrylate, dipentaerythritol pentaacrylate, or combinations thereof. In some embodiments in which at least one of the first or second polymer layers comprises a polymerized (e.g., cross-linked) acrylate or methacrylate, the siloxane reaction product includes an amide bond that is formed from reaction between the amino group of the secondary or tertiary amino-functional silane and the acrylate or methacrylate.

Useful methods for flash evaporation and vapor deposition followed by crosslinking in situ, can be found, for example, in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in PCT International Publication No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

The secondary or tertiary amino-functional silane and the first and/or second polymer layer precursor may be co-deposited or sequentially deposited. If the secondary or tertiary amino-functional silane and the first and/or second polymer layer precursor are co-deposited, they may be evaporated separately or as a mixture. In either of these embodiments, the secondary or tertiary amino-functional silane may be present at up to 20% by weight (% wt.) in the co-deposited silane and polymer precursor; in some embodiments, up to 19%, 18%, 17%, 16%, 15%, 14%, 13%, 12%, 11%, 10%, 9%, 8%, 7%, 6%, 5%, 4%, 3%, 2% or even 1% wt. in the co-deposited silane and polymer precursor, based on the total weight of the co-deposited silane and polymer. If secondary or tertiary amino-functional silane and the first and/or second polymer layer precursor are sequentially deposited, the first and/or second polymer layer that comprises the siloxane reaction product may be rich in the siloxane reaction product (e.g., include more than 50% of the siloxane reaction product) or comprise only the siloxane reaction product.

In some embodiments, the smoothness and continuity of the first polymer layer 14 (and also each oxide layer 16 and second polymer layer 18) and its adhesion to the underlying substrate or layer may be enhanced by appropriate pretreatment. Examples of a suitable pretreatment regimen include an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric (or inorganic) layer. Plasma pretreatment can be particularly useful.

In some embodiments, a separate tie layer which may have a different composition than the first polymer layer 14 may also be used atop the substrate or an underlying layer to improve adhesion. The adhesion promotion layer can be, for example, a separate polymeric layer or a metal-containing layer such as a layer of metal, metal oxide, metal nitride or metal oxynitride. The tie layer may have a thickness of a few nanometers (nm) (e.g., 1 or 2 nm) to about 50 nm, and can be thicker if desired.

The desired chemical composition and thickness of the first polymer layer will depend in part on the nature and surface topography of the substrate. The thickness typically is sufficient to provide a smooth, defect-free surface to which the subsequent oxide layer can be applied. For example, the first polymer layer may have a thickness of a few nm (e.g., 2 or 3 nm) to about 5 micrometers, and can be thicker if desired.

Referring again to FIG. 1, the barrier film according to the present disclosure and/or made according to the method of the present disclosure includes at least one oxide layer 16. The oxide layer typically comprises at least one inorganic oxide. Suitable inorganic materials that may also be included are nitrides, carbides or borides of different atomic elements. Examples of inorganic materials included in the oxide layer comprise oxides, nitrides, carbides or borides of atomic elements from Groups IIA, IIIA, IVA, VA, VIA, VIIA, IB, or IIB, metals of Groups IIIB, IVB, or VB, rare-earth metals, or combinations thereof. Examples of suitable inorganic materials include silicon oxides such as silica, aluminum oxides such as alumina, titanium oxides such as titania, indium oxides, tin oxides, indium tin oxide ("ITO"), tantalum oxide, zirconium oxide, niobium oxide, aluminum nitride, silicon nitride, boron nitride, aluminum oxynitride, silicon oxynitride, boron oxynitride, zirconium oxyboride, titanium oxyboride, and combinations thereof. ITO is an example of a special class of ceramic materials that can become electrically conducting with the proper selection of the relative proportions of each elemental constituent. In some embodiments, the oxide layer 16 comprises at least one of silicon aluminum oxide or ITO. While the barrier films disclosed herein include at least one oxide layer 16 between first and second polymer layers 14 and 18, in some embodiments, an inorganic layer, for example, an inorganic oxide layer, may be applied to the uppermost second polymer layer 18.

In some embodiments, the composition of the oxide layer 16 may change in the thickness direction of the layer. In such embodiments, the oxide layer may include at least two inorganic materials, and the ratio of the two inorganic materials changes throughout the thickness of the oxide layer. The ratio of two inorganic materials refers to the relative proportions of each of the inorganic materials. The ratio can be, for example, a mass ratio, a volume ratio, a concentration ratio, a molar ratio, a surface area ratio, or an atomic ratio. A multilayer gradient inorganic-polymer barrier stack can be made with alternating gradient oxide layers and thin, vacuum-deposited second polymer layers to provide unique optical properties as well as excellent barrier properties as measured by water vapor transmission rate. The optical properties may be affected if the gradient change in composition of the layer produces corresponding change in refractive index through the layer. The materials can be chosen such that the refractive index can change from high to low, or vice versa. For example, going from a high refractive index to a low refractive index can allow light traveling in one direction to easily pass through the layer, while light travelling in the opposite direction may be reflected by the layer. The refractive index change can be used to design layers to enhance light extraction from a light emitting device being protected by the layer. The refractive index change can instead be used to pass light through the layer and into a light harvesting device such as a solar cell. Other optical constructions, such as band pass filters, can also be incorporated into the layer while retaining desirable barrier properties.

In some embodiments in which the oxide layer is a gradient oxide layer, a first inorganic material is silicon oxide, and a second inorganic material is aluminum oxide. In these embodiments, the atomic ratio of silicon to aluminum changes throughout the thickness of the oxide layer, for example, there is more silicon than aluminum near a first surface of the oxide layer, gradually becoming more aluminum than silicon as the distance from the first surface increases. In some embodiments, the atomic ratio of silicon to aluminum can change monotonically as the distance from the first surface increases, i.e., the ratio either increases or decreases as the distance from the first surface increases. In another embodiment, the ratio does not increase or decrease monotonically. Instead, the ratio can increase in a first portion, and decrease in a second portion, as the distance from the first surface increases. In this embodiment, there can be several increases and decreases in the ratio as the distance from the first surface increases, and the ratio is non-monotonic.

The oxide layer 16 can be formed using techniques employed in the film metalizing art such as sputtering (e.g., cathode or planar magnetron sputtering), evaporation (e.g., resistive or electron beam evaporation), chemical vapor deposition, plating and the like. In some embodiments, the oxide layer 16 is formed using sputtering, e.g., reactive sputtering Enhanced barrier properties have been observed when the oxide layer is formed by a high energy deposition technique such as sputtering compared to lower energy techniques such as conventional chemical vapor deposition processes. Without being bound by theory, it is believed that the enhanced properties are due to the film-forming species arriving at the substrate with greater kinetic energy as occurs in sputtering, leading to a lower void fraction as a result of compaction.

In some embodiments, the sputter deposition process can use dual targets powered by an alternating current (AC) power supply in the presence of a gaseous atmosphere having inert and reactive gases, for example argon and oxygen, respectively. The AC power supply alternates the polarity to each of the dual targets such that for half of the AC cycle one target is the cathode and the other target is the anode. On the next cycle the polarity switches between the dual targets. This switching occurs at a set frequency, for example about 40 kHz, although other frequencies can be used. Oxygen that is introduced into the process forms oxide layers on both the substrate receiving the inorganic composition, and also on the surface of the target. The dielectric oxides can become charged during sputtering, thereby disrupting the sputter deposition process. Polarity switching can neutralize the surface material being sputtered from the targets, and can provide uniformity and better control of the deposited material.

In some embodiments, the sputter deposition process can use targets powered by direct current (DC) power supplies in the presence of a gaseous atmosphere having inert and reactive gasses, for example argon and oxygen, respectively. The DC power supplies supply power (e.g. pulsed power) to each cathode target independent of the other power supplies. In this aspect, each individual cathode target and the corresponding material can be sputtered at differing levels of power, providing additional control of composition through the layer thickness. The pulsing aspect of the DC power supplies is similar to the frequency aspect in AC sputtering, allowing control of high rate sputtering in the presence of reactive gas species such as oxygen. Pulsing DC power supplies allow control of polarity switching, can neutralize the surface material being sputtered from the targets, and can provide uniformity and better control of the deposited material.

Each of the targets used for dual AC sputtering can include a single metal or nonmetal element, or a mixture of metal and/or nonmetal elements. A first portion of the oxide layer closest to the moving substrate is deposited using the first set of sputtering targets. The substrate then moves proximate the second set of sputtering targets and a second portion of the oxide layer is deposited on top of the first portion using the second set of sputtering targets. In some embodiments, the composition of the oxide layer changes in the thickness direction through the layer.

In some embodiments, improved control during sputtering can be achieved by using a mixture, or atomic composition, of elements in each target, for example a target may include a mixture of aluminum and silicon. In another embodiment, the relative proportions of the elements in each of the targets can be different, to readily provide for a varying atomic ratio throughout the oxide layer. In one embodiment, for example, a first set of dual AC sputtering targets may include a 90/10 mixture of silicon and aluminum, and a second set of dual AC sputtering targets may include a 75/25 mixture of aluminum and silicon. In this embodiment, a first portion of the oxide layer can be deposited with the 90% Si/10% Al target, and a second portion can be deposited with the 75% Al/25% Si target. The resulting oxide layer has a gradient composition that changes from about 90% Si to about 25% Si (and conversely from about 10% Al to about 75% Al) through the thickness of the oxide layer.

The barrier film can be fabricated by deposition of the various layers onto the substrate, in a roll-to-roll vacuum chamber similar to the system described in U.S. Pat. No. 5,440,446 (Shaw et al.) and U.S. Pat. No. 7,018,713 (Padiyath, et al.). The deposition of the layers can be in-line, and in a single pass through the system. In some cases, the barrier film can pass through the system several times, to form a multilayer barrier film having several dyads.

Figure 2:
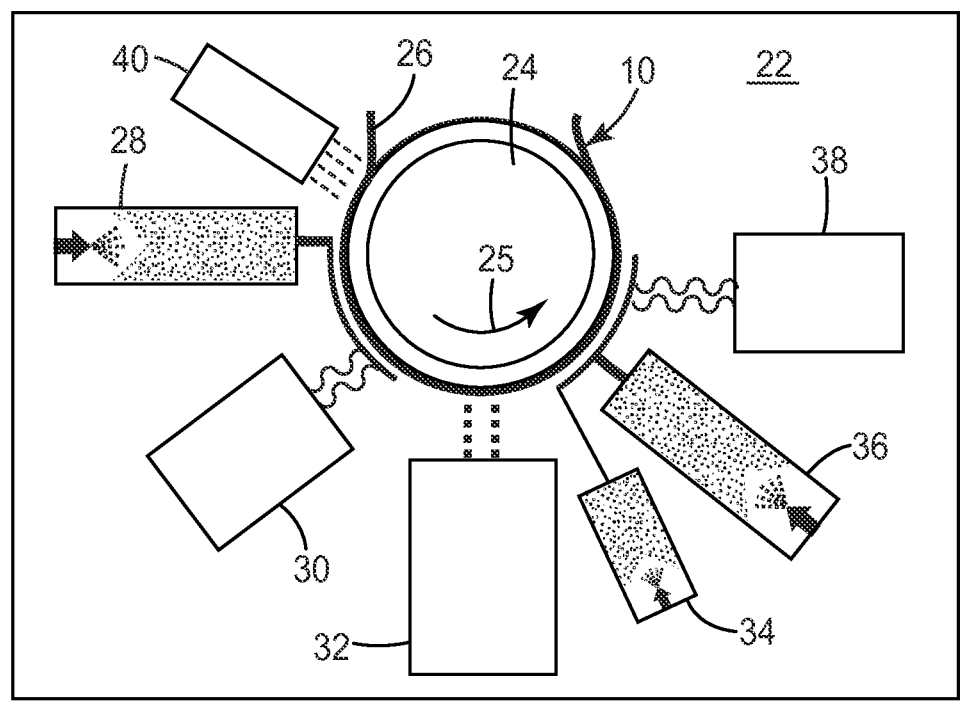
FIG. 2 is a diagram illustrating an embodiment of a process and apparatus for making a barrier film according to the present disclosure.

FIG. 2 is a diagram of a system 22, illustrating a method of making barrier film 10. System 22 is under vacuum and includes a chilled drum 24 for receiving and moving the substrate 12 (FIG. 1), as represented by a film 26, thereby providing a moving web on which to form the barrier layers. In some embodiments, a nitrogen plasma treatment unit 40 may be used to plasma treat or prime film 26 in order to improve adhesion of the first polymer layer 14 (FIG. 1) to substrate 12 (FIG. 1). An evaporator 28 applies a first polymer precursor, which is cured by curing unit 30 to form first polymer layer 14 (FIG. 1) as drum 24 advances the film 26 in a direction shown by arrow 25. An oxide sputter unit 32 applies an oxide to form layer 16 (FIG. 1) as drum 24 advances film 26. For additional alternating oxide layers 16 and first polymer layers 18, drum 24 can rotate in a reverse direction opposite arrow 25 and then advance film 26 again to apply the additional alternating oxide layers 16 and first polymer layers 14, and that sub-process can be repeated as often as desired.

In the illustrated embodiment, drum 24 further advances the film, and an optional evaporator 34 provides a secondary or tertiary amino-functional silane, and an evaporator 36 provides a second polymer layer precursor. The secondary or tertiary amino-functional silane and the second polymer precursor can be co-deposited, and as drum 24 advances the film, cured together by curing unit 38 to form the second polymer layer 18. Generally, each evaporator 34 and 36 would be connected to a source of the material to be deposited. In other embodiments, a mixture of the secondary or tertiary amino-functional silane and the second polymer precursor can be evaporated from one evaporator 36. In still other embodiments, a curable polymer precursor can be evaporated from evaporator 34, deposited, and cured with curing unit 38, and subsequently a secondary or tertiary amino-functional silane can be evaporated, deposited, and formed into a second polymer layer comprising a siloxane reaction product of the secondary or tertiary amino-functional silane in the presence of water vapor as described above. For additional alternating oxide layers 16 and second polymer layers 18, drum 24 can rotate in a reverse direction opposite arrow 25 and then advance film 26 again to apply the additional alternating oxide layers 16 and second polymer layers 18, and that sub-process can be repeated for as many alternating layers or dyads as desired or needed. In some embodiments, forming the siloxane reaction product occurs at least in part on the oxide layer 16 as described above.

The term "barrier film" refers to films that provide a barrier to at least one of oxygen or water. Barrier films are typically selected such that they have oxygen and water transmission rates at a specified level as required by the application. In some embodiments, the barrier film according to the present disclosure and/or made according to the method of the present disclosure has a water vapor transmission rate (WVTR) less than about 0.005 g/m$^2$/day at 38° C. and 100% relative humidity; in some embodiments, less than about 0.0005 g/m$^2$/day at 38° C. and 100% relative humidity; and in some embodiments, less than about 0.00005 g/m$^2$/day at 38° C. and 100% relative humidity. In some embodiments, the barrier film has a WVTR of less than about 0.05, 0.005, 0.0005, or 0.00005 g/m$^2$/day at 50° C. and 100% relative humidity or even less than about 0.005, 0.0005, 0.00005 g/m$^2$/day at 85° C. and 100% relative humidity. In some embodiments, the barrier film has an oxygen transmission rate of less than about 0.005 g/m$^2$/day at 23° C. and 90% relative humidity; in some embodiments, less than about 0.0005 g/m$^2$/day at 23° C. and 90% relative humidity; and in some embodiments, less than about 0.00005 g/m$^2$/day at 23° C. and 90% relative humidity.

Barrier films according to the present disclosure generally do not exhibit delamination or curl that can arise from thermal stresses or shrinkage in a multilayer structure. Herein, curl is measured using a curl gauge described in "Measurement of Web Curl" by Ronald P. Swanson presented in the 2006 AWEB conference proceedings (Association of Industrial Metallizers, Coaters and Laminators, Applied Web Handling Conference Proceedings, 2006). According to this method curl can be measured to the resolution of 0.25 in$^{-1}$ curvature. In some embodiments, barrier films according to the present disclosure exhibit curls of up to 7, 6, 5, 4, or 3 m$^{-1}$. From solid mechanics, the curvature of a beam is known to be proportional to the bending moment applied to it. The magnitude of bending stress is in turn is known to be proportional to the bending moment. From these relations the curl of a sample can be used to compare the residual stress in relative terms. Barrier films also typically exhibit high peel adhesion to EVA, and other common encapsulants for photovoltaics, cured on a substrate. The properties of the barrier films disclosed herein typically are maintained even after high temperature and humidity aging.

In a further aspect, the disclosure describes methods of using a barrier film made as described above in an article selected from a solid state lighting device, a display device, and combinations thereof. Examples of solid state lighting devices include semiconductor light-emitting diodes (SLEDs, more commonly known as LEDs), organic light-emitting diodes (OLEDs), or polymer light-emitting diodes (PLEDs). Examples of display devices include liquid crystal displays, OLED displays, and quantum dot displays.

Barrier films of the present disclosure have a number of applications and advantages in the display, lighting (e.g., solid state lighting), and electronic device markets as flexible replacements for glass encapsulating materials. Thus, some embodiments of the present disclosure provide barrier films which exhibit improved moisture resistance when used in moisture barrier applications. In some embodiments, the barrier film can be deposited directly on a substrate that includes a moisture sensitive device, a process often referred to as direct encapsulation. For example, the devices can be attached to a flexible carrier substrate, and a mask can be deposited to protect electrical connections from the oxide layer deposition. A first polymer layer and the oxide layer can be deposited as described above, and the mask can then be removed, exposing the electrical connections.

The moisture sensitive device can be, for example, an organic, inorganic, or hybrid organic/inorganic semiconductor device including a photovoltaic device such as a CIGS; a display device such as an organic light emitting diode (OLED), electrochromic, liquid crystal, quantum dot, or an electrophoretic display; an OLED or other electroluminescent solid state lighting device (e.g., a semiconductor light-emitting diode or polymer light-emitting diode); or others.

The present disclosure provides a barrier assembly comprising the barrier film according to any one of the aforementioned embodiments of the present disclosure and/or made according to any one of the aforementioned embodiments of the present disclosure, wherein a major surface of the barrier film is adhered to a top sheet with a pressure sensitive adhesive. Useful materials that can form the top sheet include polyesters, polycarbonates, polyethers, polyimides, polyolefins, fluoropolymers, and combinations thereof.

In embodiments wherein the barrier assembly according to the present disclosure is used, for example, for encapsulating solar devices, it is typically desirable for the top sheet to be resistant to degradation by ultraviolet (UV) light and weatherable. Photo-oxidative degradation caused by UV light (e.g., in a range from 280 to 400 nm) may result in color change and deterioration of optical and mechanical properties of polymeric films. The top sheets described herein can provide, for example, a durable, weatherable topcoat for a photovoltaic device. The substrates are generally abrasion and impact resistant and can prevent degradation of, for example, photovoltaic devices when they are exposed to outdoor elements.

A variety of stabilizers may be added to the top sheet to improve its resistance to UV light. Examples of such stabilizers include at least one of ultraviolet absorbers (UVA) (e.g., red shifted UV absorbers), hindered amine light stabilizers (HALS), or anti-oxidants. These additives are described in further detail below. In some embodiments, the phrase "resistant to degradation by ultraviolet light" means that the top sheet includes at least one ultraviolet absorber or hindered amine light stabilizer. In some embodiments, the phrase "resistant to degradation by ultraviolet light" means that the top sheet at least one of reflects or absorbs at least 50 percent of incident ultraviolet light over at least a 30 nanometer range in a wavelength range from at least 300 nanometers to 400 nanometers. In some of these embodiments, the top sheet need not include UVA or HALS.

The UV resistance of the top sheet can be evaluated, for example, using accelerated weathering studies. Accelerated weathering studies are generally performed on films using techniques similar to those described in ASTM G-155, "Standard practice for exposing non-metallic materials in accelerated test devices that use laboratory light sources". The noted ASTM technique is considered a sound predictor of outdoor durability, that is, ranking materials performance correctly. One mechanism for detecting the change in physical characteristics is the use of the weathering cycle described in ASTM G155 and a D65 light source operated in the reflected mode. Under the noted test, and when the UV protective layer is applied to the article, the article should withstand an exposure of at least 18,700 kJ/m$^2$ at 340 nm before the b* value obtained using the CIE L*a*b* space increases by 5 or less, 4 or less, 3 or less, or 2 or less before the onset of significant cracking, peeling, delamination or haze.

In some embodiments, the top sheet in the barrier assemblies disclosed herein comprises a fluoropolymer. Fluoropolymers typically are resistant to UV degradation even in the absence of stabilizers such as UVA, HALS, and anti-oxidants. Useful fluoropolymers include ethylene-tetrafluoroethylene copolymers (ETFE), tetrafluoroethylene-hexafluoropropylene copolymers (FEP), tetrafluoroethylene-hexafluoropropylene-vinylidene fluoride copolymers (THV), polyvinylidene fluoride (PVDF), blends thereof, and blends of these and other fluoropolymers.

The substrates comprising fluoropolymer can also include non-fluorinated materials. For example, a blend of polyvinylidene fluoride and polymethyl methacrylate can be used. Useful flexible, visible and infrared light-transmissive substrates also include multilayer film substrates. Multilayer film substrates may have different fluoropolymers in different layers or may include at least one layer of fluoropolymer and at least one layer of a non-fluorinated polymer. Multilayer films can comprise a few layers (e.g., at least 2 or 3 layers) or can comprise at least 100 layers (e.g., in a range from 100 to 2000 total layers or more). The different polymers in the different multilayer film substrates can be selected, for example, to reflect a significant portion (e.g., at least 30, 40, or 50%) of UV light in a wavelength range from 300 to 400 nm as described, for example, in U.S. Pat. No. 5,540,978 (Schrenk).

Useful top sheets comprising a fluoropolymer can be commercially obtained, for example, from E.I. duPont De Nemours and Co., Wilmington, Del., under the trade designation "TEFZEL ETFE" and "TEDLAR", from Dyneon LLC, Oakdale, Minn., under the trade designations "DYNEON ETFE", "DYNEON THV", "DYNEON FEP", and "DYNEON PVDF", from St. Gobain Performance Plastics, Wayne, N.J., under the trade designation "NORTON ETFE", from Asahi Glass under the trade designation "CYTOPS", and from Denka Kagaku Kogyo KK, Tokyo, Japan under the trade designation "DENKA DX FILM".

The barrier assemblies according to the present disclosure in which a barrier film is adhered to a top sheet are typically adhered with a pressure sensitive adhesive (PSA). PSAs are well known to those of ordinary skill in the art to possess properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as PSAs are polymers designed and formulated to exhibit the requisite viscoelastic properties resulting in a desired balance of tack, peel adhesion, and shear holding power.

One method useful for identifying pressure sensitive adhesives is the Dahlquist criterion. This criterion defines a pressure sensitive adhesive as an adhesive having a 1 second creep compliance of greater than $1\times10^{-6}$ cm$^2$/dyne as described in "Handbook of Pressure Sensitive Adhesive Technology", Donatas Satas (Ed.), $2^{nd}$ Edition, p. 172, Van Nostrand Reinhold, New York, N.Y., 1989. Alternatively, since modulus is, to a first approximation, the inverse of creep compliance, pressure sensitive adhesives may be defined as adhesives having a storage modulus of less than about $1\times10^6$ dynes/cm$^2$.

PSAs useful for practicing the present disclosure typically do not flow and have sufficient barrier properties to provide slow or minimal infiltration of oxygen and moisture through the adhesive bond line. Also, the PSAs disclosed herein are generally transmissive to visible and infrared light such that they do not interfere with absorption of visible light, for example, by photovoltaic cells. The PSAs may have an average transmission over the visible portion of the spectrum of at least about 75% (in some embodiments at least about 80, 85, 90, 92, 95, 97, or 98%) measured along the normal axis. In some embodiments, the PSA has an average transmission over a range of 400 nm to 1400 nm of at least about 75% (in some embodiments at least about 80, 85, 90, 92, 95, 97, or 98%). Examples of PSAs include acrylates, silicones, polyisobutylenes, ureas, and combinations thereof. Some useful commercially available PSAs include UV curable PSAs such as those available from Adhesive Research, Inc., Glen Rock, Pa., under the trade designations "ARclear 90453" and "ARclear 90537" and acrylic optically clear PSAs available, for example, from 3M Company, St. Paul, Minn., under the trade designations "OPTICALLY CLEAR LAMINATING ADHESIVE 8171", "OPTICALLY CLEAR LAMINATING ADHESIVE 8172", and "OPTICALLY CLEAR LAMINATING ADHESIVE 8172P". As used herein, the term "acrylic" or "acrylate" includes compounds having at least one of acrylic or methacrylic groups. Further examples of PSAs and methods of making them can be found, for example, in U.S. Pat. App. Pub. Nos. 2012-0003451 (Weigel et al.) and the references cited therein.

In some embodiments, PSAs useful for practicing the present disclosure have a modulus (tensile modulus) up to 50,000 psi ($3.4 \times 10^8$ Pa). The tensile modulus can be measured, for example, by a tensile testing instrument such as a testing system available from Instron, Norwood, Mass., under the trade designation "INSTRON 5900". In some embodiments, the tensile modulus of the PSA is up to 40,000, 30,000, 20,000, or 10,000 psi ($2.8 \times 10^8$ Pa, $2.1 \times 10^8$ Pa, $1.4 \times 10^8$ Pa, or $6.9 \times 10^8$ Pa).

In some embodiments, the PSA layer disclosed herein is at least 0.005 mm (in some embodiments, at least 0.01, 0.02, 0.03, 0.04, or 0.05 mm) in thickness. In some embodiments, the PSA layer has a thickness up to about 0.2 mm (in some embodiments, up to 0.15, 0.1, or 0.075 mm) in thickness. For example, the thickness of the PSA layer may be in a range from 0.005 mm to 0.2 mm, 0.005 mm to 0.1 mm, or 0.01 to 0.1 mm.

Not only does the PSA serve as a convenient means for attaching the top sheet to the barrier film in the barrier assembly disclosure herein, it is also believed that the PSA layer serves to protect the barrier assembly from thermal stresses that may be caused by CTE mismatch between the top sheet, which may be a fluoropolymer, and the substrate of the barrier film. When the PSA layer contains at least one of UVA, HALS, or anti-oxidants, it can further provide protection to the barrier film from degradation by UV light.

Examples of useful UVAs that may be included in the PSA or the top sheet in an assembly disclosed herein include those available from BASF, Florham Park, N.J., under the trade designations "TINUVIN 328", "TINUVIN 326", "TINUVIN 783", "TINUVIN 770", "TINUVIN 479", "TINUVIN 928", and "TINUVIN 1577". UVAs, when used, can be present in an amount from about 0.01 to 3 percent by weight based on the total weight of the PSA composition or the top sheet. Examples of useful antioxidants include hindered phenol-based compounds, phosphoric acid ester-based compounds, and those available from BASF under the trade designations "IRGANOX 1010", "IRGANOX 1076", and "IRGAFOS 126" and butylated hydroxytoluene (BHT)). Antioxidants, when used, can be present in an amount from about 0.01 to 2 percent by weight based on the total weight of the PSA composition or top sheet. Examples of useful stabilizers include phenol-based stabilizers, hindered amine-based stabilizers (e.g., including those available from BASF under the trade designation "CHIMASSORB" such as "CHIMASSORB 2020"), imidazole-based stabilizers, dithiocarbamate-based stabilizers, phosphorus-based stabilizers, and sulfur ester-based stabilizers. Such compounds, when used, can be present in an amount from about 0.01 to 3 percent by weight based on the total weight of the PSA composition or top sheet.

Assemblies according to the present disclosure are useful, for example, for encapsulating solar devices. In some embodiments, the assembly is disposed on, above, or around a photovoltaic cell. Accordingly, the present disclosure provides a method comprising applying an assembly disclosed herein to the front surface of a photovoltaic cell. Suitable solar cells include those that have been developed with a variety of materials each having a unique absorption spectrum that converts solar energy into electricity. Each type of semiconductor material will have a characteristic band gap energy which causes it to absorb light most efficiently at certain wavelengths of light, or more precisely, to absorb electromagnetic radiation over a portion of the solar spectrum. Examples of materials used to make solar cells and their solar light absorption band-edge wavelengths include: crystalline silicon single junction (about 400 nm to about 1150 nm), amorphous silicon single junction (about 300 nm to about 720 nm), ribbon silicon (about 350 nm to about 1150 nm), CIS (Copper Indium Selenide) (about 400 nm to about 1300 nm), CIGS (Copper Indium Gallium di-Selenide) (about 350 nm to about 1100 nm), CdTe (about 400 nm to about 895 nm), GaAs multi-junction (about 350 nm to about 1750 nm). The shorter wavelength left absorption band edge of these semiconductor materials is typically between 300 nm and 400 nm. One skilled in the art understands that new materials are being developed for more efficient solar cells having their own unique longer wavelength absorption band-edge. In some embodiments, the assembly disclosed herein is disposed on, above, or around a CIGS cell. In some embodiments of barrier assemblies according to the present disclosure, the solar device (e.g., the photovoltaic cell) to which the assembly is applied comprises a flexible film substrate. In some embodiments, the major surface of the barrier film opposite the major surface of the barrier film adhered to the top sheet is attached to the photovoltaic cell with an encapsulant. Although other encapsulants may be useful, in some embodiments, the encapsulant is ethylene vinylacetate.

Some Embodiments of the Disclosure

In a first embodiment, the present disclosure provides a barrier film comprising:
a substrate;
a first polymer layer on a major surface of the substrate;
an oxide layer on the first polymer layer; and
a second polymer layer on the oxide layer,
wherein at least one of the first or second polymer layers comprises a siloxane reaction product of a secondary or tertiary amino-functional silane having at least two independently selected silane groups, wherein the secondary or tertiary amino-functional silane is other than bis-(gamma-triethoxysilylpropyl)amine.

In a second embodiment, the present disclosure provides the barrier film of the first embodiment, wherein the secondary or tertiary amino-functional silane is represented by formula

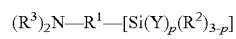

wherein
$R^1$ is a multivalent alkylene group optionally interrupted by one or more —O— groups or up to three —$NR^3$— groups;
$R^2$ is alkyl, arylalkylenyl, or —$R^1$—[Si(Y)$_p$(R$^2$)$_{3-p}$];
each $R^3$ is independently hydrogen, alkyl, arylalkylenyl, or —$R^1$—[Si(Y)$_p$(R$^2$)$_{3-p}$];
Y is alkoxy, acetoxy, aryloxy, or halogen; and
p is 1, 2, or 3;

with the provisos that at least two independently selected —Si(Y)$_p$(R$^2$)$_{3-p}$ groups are present and that both R$^3$ groups may not be hydrogen.

In a third embodiment, the present disclosure provides the barrier film of the second embodiment, wherein one R$^3$ is alkyl or hydrogen, and the other R$^3$ is —R$^1$—[Si(Y)$_p$(R$^2$)$_{3-p}$].

In a fourth embodiment, the present disclosure provides the barrier film of any one of the first to third embodiments, wherein the at least two independently selected silane groups are other than triethoxysilane groups.

In a fifth embodiment, the present disclosure provides the barrier film of any one of the first to fourth embodiments, wherein the secondary or tertiary amino-functional silane is bis(3-trimethoxysilylpropyl)amine, N-methyl-bis(3-trimethoxysilylpropyl)amine, or N,N'-bis[3-trimethoxysilyl-propyl]-ethylenediamine.

In a sixth embodiment, the present disclosure provides the barrier film of any one of the first to fourth embodiments, wherein in the at least two independently selected silane groups, Y is methoxy, acetoxy, or chloro, and p is 3.

In a seventh embodiment, the present disclosure provides the barrier film of any one of the first to sixth embodiments, wherein the siloxane reaction product shares a siloxane bond with the oxide layer.

In an eighth embodiment, the present disclosure provides the barrier film of any one of the first to seventh embodiments, wherein at least the second polymer layer comprises the siloxane reaction product.

In a ninth embodiment, the present disclosure provides the barrier film of any one of the first to eighth embodiments, wherein the barrier film comprises a plurality of alternating oxide layers and second polymer layers on the first polymer layer.

In a tenth embodiment, the present disclosure provides the barrier film of any one of the first to ninth embodiments, wherein the substrate comprises at least one of polyethylene terephthalate, polyethylene naphthalate, polyetheretherketone, polyaryletherketone, polyacrylate, polyetherimide, polyarylsulfone, polyethersulfone, polyamideimide, polyimide, ethylene-tetrafluoroethylene copolymer, tetrafluoroethylene-hexafluoropropylene copolymer, tetrafluoroethylene-hexafluoropropylene-vinylidene fluoride copolymer, or polyvinylidene fluoride, any of which may optionally be heat-stabilized.

In an eleventh embodiment, the present disclosure provides the barrier film of any one of the first to tenth embodiments, wherein at least one of the first or second polymer layers comprises a polymerized acrylate or methacrylate.

In a twelfth embodiment, the present disclosure provides the barrier film of the eleventh embodiment, wherein the acrylate or methacrylate is tricyclodecanedimethanol diacrylate, 3-(acryloxy)-2-hydroxy-propylmethacrylate, triacryloxyethyl isocyanurate, glycerol diacrylate, ethoxylated trimethylolpropane diacrylate, pentaerythritol triacrylate, pentaerythritol tetraacrylate, propoxylated (3) glyceryl diacrylate, propoxylated (5,5) glyceryl diacrylate, propoxylated (3) trimethylolpropane diacrylate, propoxylated (6) trimethylolpropane diacrylate, trimethylolpropane diacrylate, trimethylolpropane triacrylate, di-trimethylolpropane tetraacrylate, dipentaerythritol pentaacrylate, or combinations thereof.

In a thirteenth embodiment, the present disclosure provides the barrier film of the eleventh or twelfth embodiment, wherein the siloxane reaction product includes an amide bond derived from reaction between the amino group and the acrylate or methacrylate.

In a fourteenth embodiment, the present disclosure provides a barrier assembly comprising the barrier film of any one of the first to thirteenth embodiments, wherein a major surface of the barrier film is adhered to a top sheet with a pressure sensitive adhesive.

In a fifteenth embodiment, the present disclosure provides the barrier assembly of the fourteenth embodiment, wherein the top sheet comprises at least one of an ethylene-tetrafluoroethylene copolymer, a tetrafluoroethylene-hexafluoropropylene copolymer, a tetrafluoroethylene-hexafluoropropylene-vinylidene fluoride copolymer, or polyvinylidene fluoride.

In a sixteenth embodiment, the present disclosure provides the barrier assembly of the fourteenth or fifteenth embodiment, wherein a major surface of the barrier film opposite the major surface of the barrier film adhered to the top sheet is disposed on a photovoltaic cell.

In a seventeenth embodiment, the present disclosure provides the barrier assembly of the sixteenth embodiment, wherein the photovoltaic cell is a CIGS cell.

In an eighteenth embodiment, the present disclosure provides the barrier assembly of the sixteenth or seventeenth embodiment, wherein the major surface of the barrier film opposite the major surface of the barrier film adhered to the top sheet is attached to the photovoltaic cell with an encapsulant.

In a nineteenth embodiment, the present disclosure provides an article incorporating a barrier film according to any one of the first to thirteenth embodiments, wherein the article is a solid state lighting device, a display device, or a combination thereof.

In a twentieth embodiment, the present disclosure provides the article of the nineteenth embodiment, wherein the solid state lighting device is a semiconductor light-emitting diode, an organic light-emitting diode, or a polymer light-emitting diode.

In a twenty-first embodiment, the present disclosure provides the article of the nineteenth embodiment, wherein the display device is a liquid crystal display, an organic light-emitting diode display, or a quantum dot display.

In a twenty-second embodiment, the present disclosure provides a method of making a barrier film of any one of the first to seventh or tenth embodiments, the method comprising:
providing a first polymer layer to a surface of a substrate;
providing an oxide layer on the first polymer layer; and
providing a second polymer layer on the oxide layer,
wherein at least one of the first or second polymer layers comprises a siloxane reaction product of a secondary or tertiary amino-functional silane having at least two silane groups, wherein the secondary or tertiary amino-functional silane is other than bis-(gamma-triethoxysilylpropyl)amine.

In a twenty-third embodiment, the present disclosure provides the method of the twenty-second embodiment, wherein providing a second polymer layer comprises evaporating the secondary or tertiary amino-functional silane, evaporating a second polymer precursor, depositing the evaporated second polymer precursor and the evaporated secondary or tertiary amino-functional silane on the oxide layer, and curing the deposited second polymer precursor to form the second polymer layer.

In a twenty-fourth embodiment, the present disclosure provides the method of the twenty-third embodiment, wherein evaporating a second polymer precursor and evaporating the secondary or tertiary amino-functional silane together comprise evaporating a mixture of the second polymer layer precursor and the secondary or tertiary amino-functional silane.

In a twenty-fifth embodiment, the present disclosure provides the method of the twenty-third or twenty-fourth embodiment, wherein the second polymer precursor comprises at least one of an acrylate or a methacrylate monomer.

In a twenty-sixth embodiment, the present disclosure provides the method of the twenty-fifth embodiment, wherein the acrylate or methacrylate is tricyclodecanedimethanol diacrylate, 3-(acryloxy)-2-hydroxy-propylmethacrylate, triacryloxyethyl isocyanurate, glycerol diacrylate, ethoxylated trimethylolpropane diacrylate, pentaerythritol triacrylate, propoxylated (3) glyceryl diacrylate, propoxylated (5,5) glyceryl diacrylate, propoxylated (3) trimethylolpropane diacrylate, propoxylated (6) trimethylolpropane diacrylate, trimethylolpropane diacrylate, trimethylolpropane triacrylate, di-trimethylolpropane tetraacrylate, dipentaerythritol pentaacrylate, or combinations thereof.

In a twenty-seventh embodiment, the present disclosure provides the method of any one of the twenty-second to twenty-sixth embodiments, wherein providing the oxide layer comprises depositing an oxide onto the first polymer layer to form the oxide layer, wherein depositing is achieved using sputter deposition, reactive sputtering, chemical vapor deposition, or a combination thereof.

In a twenty-eighth embodiment, the present disclosure provides the method of any one of the twenty-second to twenty-seventh embodiments, wherein providing the oxide layer comprises applying a layer of an inorganic silicon aluminum oxide to the first polymer layer.

In a twenty-ninth embodiment, the present disclosure provides the method of any one of the twenty-second to twenty-eighth embodiments, further comprising sequentially repeating providing the oxide layer on the first polymer layer and providing the second polymer layer on the oxide layer to form a plurality of alternating layers of the second polymer layer and the oxide layer on the first polymer layer.

Embodiments of the present disclosure have been described above and are further illustrated below by way of the following Examples, which are not to be construed in any way as imposing limitations upon the scope of the present disclosure. On the contrary, it is to be clearly understood that resort may be had to various other embodiments, modifications, and equivalents thereof which, after reading the description herein, may suggest themselves to those skilled in the art without departing from the spirit of the present disclosure and/or the scope of the appended claims.

EXAMPLES

The following examples are intended to illustrate embodiments within the scope of this disclosure. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Preparation of Comparative Laminate Constructions A-F And Laminate Constructions 1-3

Comparative Laminate Constructions A-F and Laminate Constructions 1-3 were prepared by using a 0.05 mm thick pressure sensitive adhesive (PSA) (obtained under the trade designation "3M OPTICALLY CLEAR ADHESIVE 8172P" from 3M Company, St. Paul, Minn.) to laminate 22.9 cm by 15.2 cm barrier films to an ethylene tetrafluoroethylene polymer sheet (ETFE) (0.05 mm thick, available under the trade designation "NORTON ETFE", from St. Gobain Performance Plastics, Wayne, N.J.), with the second polymer layer of the barrier film adjacent the ETFE sheet. Comparative Laminate Constructions A-F and Laminate Constructions 1-3 were prepared using barrier films of, respectively, Comparative Examples A-F, and Examples 1-3. The polyethylene terephtalate (PET) side of the laminated barrier film was then placed on the polytetrafluoroethylene (PTFE) side of a 0.14 mm (0.0056 in) thick 21.6 cm by 14 cm PTFE-coated aluminum foil (obtained under the trade designation "8656K61", from McMaster-Carr, Santa Fe Springs, Calif.). The PTFE-coated aluminum foil was 1.27 cm smaller than the barrier film in each dimension, thus leaving a portion of the PET exposed. A laminated barrier sheet was prepared by placing a 13 mm (0.5 in) wide desiccated edge tape (obtained under the trade designation "SOLARGAIN EDGE TAPE SET LP01" from Truseal Technologies Inc., Solon, Ohio) around the perimeter of the PTFE-coated aluminum foil to secure the laminated barrier film to the PTFE layer. A 0.38 cm (0.015 in) thick encapsulant film (obtained under the trade designation "JURASOL" from JuraFilms, Downer Grove, Ill.) was placed on the aluminum side of the PTFE-coated aluminum foil. The PET layer of a second laminated barrier sheet, identical in composition to the first laminated barrier sheet, was disposed over the encapsulant film, to form a laminate construction. The construction was vacuum laminated at 150° C. for 12 min.

Test Methods

Spectral Transmission

Spectral transmission was measured using a spectrometer (model "LAMBDA 900", commercially available from PerkinElmer, Waltham, Mass.). Spectral transmission is reported as average percent transmission (Tvis) between 400 nm and 700 nm at a 0° angle of incidence.

Water Vapor Transmission Rate

Water vapor transmission rate (WVTR) of the barrier films of Comparative Examples A-F, and Examples 1-3, was measured in accordance with the procedure outlined in ASTM F-1249-06, "Standard Test Method for Water Vapor Transmission Rate Through Plastic Film and Sheeting Using a Modulated Infrared Sensor", using a MOCON PERMATRAN-W® Model 700 WVTR testing system (obtained from MOCON, Inc, Minneapolis, Minn.). Temperature of about 50° C. and relative humidity (RH) of about 100% were used and WVTR is expressed in grams per square meter per day (g/m2/day). The lowest detection limit of the testing system was 0.005 g/m2/day. In some instances, the measured WVTR was below the lowest detection limit and is reported as <0.005 g/m2/day.

Aging Test

Laminate constructions prepared using barrier films of Comparative Examples A-F, and Examples 1-3, were placed in an environmental chamber (model "SE-1000-3", obtained from Thermotron Industries, Holland, Mich.) set to a temperature of about 85° C. and relative humidity of about 85%, for 0 (initial), 250, 500, and 1000 hours.

T-Peel Test Method

Aged and unaged barrier films of Comparative Examples A-F, and Examples 1-3, were removed from the laminate construction by peeling off the PTFE layer. The barrier films were then cut into 1.0 in wide (2.54 cm) sections. These sections were placed in a tensile strength tester (obtained under the trade designation "INISIGHT 2 SL" with Testworks 4 software from MTS, Eden Prairie, Minn.), following the procedure outlined in ASTM D 1876-08 "Standard Test Method for Peel Resistance of Adhesives (T-Peel Test)." Two clamps are used. One clamp was attached to the ETFE and PSA, and the other was attached to the PET and thin barrier layers. A peel speed of 254 mm/min (10 inches/min) was used. Adhesion is reported in Newton per centimeter (N/cm) as the average of four peel measurements between 0.05 and 5.95 cm. In some instances, T-peel adhesion was not measured and is reported as "N/M".

Comparative Example A

Barrier films were prepared by covering a polyetheylene teraphthalate (PET) substrate film (obtained from E. I. DuPont de Nemours, Wilmington, Del., under the trade name "XST 6642") with a stack of an first polymer layer, an inorganic silicon aluminum oxide (SiAlOx) barrier layer, and an second polymer layer on a vacuum coater similar to the coater described in U.S. Pat. No. 5,440,446 (Shaw et al.) and U.S. Pat. No. 7,018,713 (Padiyath, et al), both of which are incorporated herein by reference. The individual layers were formed as follows:

Layer 1 (first polymer layer): a 350 meter long roll of 0.127 mm thick×366 mm wide PET film (commercially available from DuPont, Wilmington, Del., under the trade designation "XST 6642") was loaded into a roll-to-roll vacuum processing chamber. The chamber was pumped down to a pressure of $1\times10^{-5}$ Torr. A web speed of 4.8 meter/min was held while maintaining the backside of the PET film in contact with a coating drum chilled to −10° C. With the backside in contact with the drum, the film frontside surface was treated with a nitrogen plasma at 0.02 kW of plasma power. The film frontside surface was then coated with tricyclodecane dimethanol diacrylate monomer (obtained under the trade designation "SR-833S", from Sartomer USA, Exton, Pa.). The monomer was degassed under vacuum to a pressure of 20 mTorr prior to coating, loaded into a syringe pump, and pumped at a flow rate of 1.33 mL/min through an ultrasonic atomizer operating at a frequency of 60 kHz into a heated vaporization chamber maintained at 260° C. The resulting monomer vapor stream condensed onto the film surface and was electron beam crosslinked using a multi-filament electron-beam cure gun operating at 7.0 kV and 4 mA to form a 720 nm thick first polymer layer.

Layer 2 (inorganic layer): immediately after the first polymer layer deposition and with the backside of the PET film still in contact with the drum, a SiAlOx layer was sputter-deposited atop a 23 m length of the first polymer layer. Two alternating current (AC) power supplies were used to control two pairs of cathodes; with each cathode housing two 90% Si/10% Al sputtering targets (obtained from Materion Corporation, Mayfield Heights, Ohio). During sputter deposition, the voltage signal from each power supply was used as an input for a proportional-integral-differential control loop to maintain a predetermined oxygen flow to each cathode. The AC power supplies sputtered the 90% Si/10% Al targets using 5000 watts of power, with a gas mixture containing 450 standard cubic centimeter per minute (sccm) argon and 63 sccm oxygen at a sputter pressure of 3.5 millitorr. This provided a 30 nm thick SiAlOx layer deposited atop the first polymer layer of Layer 1.

Layer 3 (second polymer layer): immediately after the SiAlOx layer deposition and with the backside of the PET film still in contact with the drum, the acrylate monomer (same monomer of Layer 1) was condensed onto Layer 2 and crosslinked as described in Layer 1, except that a multi-filament electron-beam cure gun operating at 7 kV and 5 mA was used. This provided a 720 nm thick second polymer layer atop Layer 2.

Initial T-peel adhesion, spectral transmission (Tvis) and water vapor transmission rate (WVTR) of the barrier film of Comparative Example A were measured using the test methods described above. The barrier film was then aged, following the procedure outlined above, for 250, 500 and 1000 hours. T-peel adhesion was measured for the aged sample. Results are reported in Table 1, below.

Comparative Example B

A barrier film was prepared as described in Comparative Example A, with the exception that Layer 3 (second polymer layer) was a mixture of 97 weight percent (wt %) of the tricyclodecane dimethanol diacrylate monomer and 3 wt % of N-butyl-aminopropyltrimethoxysilane (obtained from Evonik, Piscataway,N.J., under the trade designation "DYNASYLAN 1189").

Initial T-peel adhesion, spectral transmission (Tvis) and water vapor transmission rate (WVTR) of the barrier film of Comparative Example B were measured using the test methods described above. The barrier film was then aged, following the procedure outlined above, for 250, 500 and 1000 hours. T-peel adhesion was measured for the aged sample. Results are reported in Table 1, below.

Comparative Example C

A barrier film was prepared as described in Comparative Example B, with the exception that Layer 3 (second polymer layer) was a mixture of 97 weight percent (wt %) of the tricyclodecane dimethanol diacrylate monomer and 3 wt % N,N-diethyl-aminopropyltrimethoxysilane (obtained under the trade designation "SID3396.0", from Gelest, Morrisville, Pa.).

Initial T-peel adhesion, spectral transmission (Tvis) and water vapor transmission rate (WVTR) of the barrier film Comparative Example C were measured using the test methods described above. The barrier film was then aged, following the procedure outlined above, for 250 and 500 hours. T-peel adhesion was measured for the aged sample. Results are reported in Table 1, below.

Comparative Example D

A barrier film was prepared as described in Comparative Example B, with the exception that Layer 3 (second polymer layer) was a mixture of 97 weight percent (wt %) of the tricyclodecane dimethanol diacrylate monomer and 3 wt % of N-n-butyl-AZA-2,2-dimethoxysilacyclopentane (commercially available from Gelest, Morrisville, Pa., under the trade designation "1932.4").

Initial T-peel adhesion, spectral transmission (Tvis) and water vapor transmission rate (WVTR) of the barrier film of Comparative Example D were measured using the test methods described above. The barrier film was then aged, following the procedure outlined above, for 250, 500, and 1000 hours. T-peel adhesion was measured for the aged sample. Results are reported in Table 1, below.

Comparative Example E

A barrier film was prepared as described in Comparative Example B, with the exception that Layer 3 (second polymer layer) was a mixture of 97 weight percent (wt %) of the tricyclodecane dimethanol diacrylate monomer and 3 wt % of bis (3-triethoxysilylpropyl)amine (obtained from Evonik, Piscataway, N.J., under the trade designation "DYNASYLAN 1122"). This compound is also known as bis-(gamma-triethoxysilylpropyl)amine.

Initial T-peel adhesion, spectral transmission (Tvis) and water vapor transmission rate (WVTR) of the barrier film of Comparative Example E were measured using the test methods described above. The barrier film was then aged, following the procedure outlined above, for 500 and 1000 hours. T-peel adhesion was measured for the aged sample. Results are reported in Table 1, below.

Comparative Example F

A barrier film was prepared as described in Comparative Example B, with the exception that the barrier film was made in a second manufacturing operation.

Initial T-peel adhesion, spectral transmission (Tvis) and water vapor transmission rate (WVTR) of the barrier film of Comparative Example F were measured using the test methods described above. The barrier film was then aged, following the procedure outlined above, for 500 and 1000 hours. T-peel adhesion was measured for the aged sample. Results are reported in Table 1, below.

Example 1

A barrier film was prepared as described in Comparative Example B, with the exception that Layer 3 (second polymer layer) was a mixture of 97 weight percent (wt %) of the tricyclodecane dimethanol diacrylate monomer and 3 wt % of bis(3-trimethoxysilylpropyl)amine (obtained under the trade designation "DYNASYLAN 1124", from Evonik).

Initial T-peel adhesion, spectral transmission (Tvis) and water vapor transmission rate (WVTR) of the barrier film of Example 1 were measured using the test methods described above. The barrier film was then aged, following the procedure outlined above, for 250, and 500 hours. T-peel adhesion was measured for the aged sample. Results are reported in Table 1, below.

Example 2

A barrier film was prepared as described in Example 1, with the exception that Layer 3 (second polymer layer) was a mixture of 97 weight percent (wt %) of the tricyclodecane dimethanol diacrylate monomer and 3 wt % of a N-methyl-bis(3-trimethoxysilylpropyl)amine (obtained under the trade designation "SIB1835.0", from Gelest).

Initial T-peel adhesion, spectral transmission (Tvis) and water vapor transmission rate (WVTR) of the barrier film of Example 2 were measured using the test methods described above. The barrier film was then aged, following the procedure outlined above, for 250 and 500 hours. T-peel adhesion was measured for the aged sample. Results are reported in Table 1, below.

Example 3

A barrier film was prepared as described in Example 1, with the exception that the barrier film was made in a second manufacturing operation.

Initial T-peel adhesion, spectral transmission (Tvis) and water vapor transmission rate (WVTR) of the barrier film of Example 3 were measured using the test methods described above. The barrier film was then aged, following the procedure outlined above, for 500 and 1000 hours. T-peel adhesion was measured for the aged sample. Results are reported in Table 1, below.

TABLE 1

| Examples | Spectral Transmission (%) | WVTR (g/m2/day) | Initial (0 hours) | T-peel adhesion (N/cm) | | |
|---|---|---|---|---|---|---|
| | | | | 250 hours | 500 hours | 1000 hours |
| Comparative Example A | 87 | <0.005 | 0.3 | 0.1 | 0.1 | 0.1 |
| Comparative Example B | 87 | <0.005 | 5.3 | 9.5 | 9.7 | 0.4 |
| Comparative Example C | 87 | <0.005 | 0.4 | 0.3 | N/M | 0.3 |
| Comparative Example D | 87 | <0.005 | 6.0 | 10.1 | 8.9 | 0.4 |
| Comparative Example E | 87 | <0.005 | 5.2 | N/M | 9.4 | 2.2 |
| Comparative Example F | 87 | <0.005 | 5.2 | N/M | 0.4 | 0.3 |
| Example 1 | 87 | <0.005 | 6.0 | 10.6 | N/M | 11.3 |
| Example 2 | 87 | <0.005 | 6.2 | 10.3 | N/M | 6.0 |
| Example 3 | 87 | <0.005 | 5.2 | N/M | 9.8 | 8.6 |

In these examples and comparative examples, the only difference between the samples is the silane. Therefore, it is believed that the enhanced peel adhesion is due to the presence of the secondary or tertiary amino-functional silane having at least two independently selected silane groups.

While the specification has described in detail some embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. Furthermore, all publications, published patent applications and issued patents referenced herein are incorporated by reference in their entirety to the same extent as if each individual publication or patent was specifically and individually indicated to be incorporated by reference. Various embodiments have been described. These and other embodiments are within the scope of the following listing of embodiments and claims.

What is claimed is:
1. A barrier film comprising:
   a substrate;
   a first polymer layer on a major surface of the substrate;
   a silicon aluminum oxide layer on the first polymer layer; and
   a second polymer layer on the silicon aluminum oxide layer,
wherein the second polymer layer comprises a polymerized acrylate or methacrylate and a range from one percent by weight to five percent by weight based on the total weight of the second polymer layer of a siloxane reaction product of a secondary or tertiary amino-functional silane represented by formula

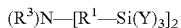

$(R^3)N—[R^1—Si(Y)_3]_2$ wherein
$R^1$ is a divalent alkylene group having up to 6 carbon atoms;
$R^3$ is hydrogen or methyl; and
Y is methoxy,
wherein the second polymer layer is formed by evaporation and vapor deposition of a polymerizable acrylate or methacrylate and the secondary or tertiary amino-functional silane in the presence of water vapor, wherein the polymerizable acrylate or methacrylate is tricyclodecanedimethanol diacrylate, triacryloxyethyl isocyanurate, pentaerythritol tetraacrylate, trimethylolpropane triacrylate, di-trimethylolpropane tetraacrylate, or a combination thereof.

2. The barrier film of claim 1, wherein the secondary or tertiary amino-functional silane is bis(3-trimethoxysilylpropyl)amine or N-methyl-bis(3-trimethoxysilylpropyl)amine.

3. The barrier film of claim 1, wherein the barrier film comprises a plurality of alternating oxide layers and second polymer layers on the first polymer layer.

4. The barrier film of claim 1, wherein the substrate comprises at least one of polyethylene terephthalate, polyethylene naphthalate, polyetheretherketone, polyaryletherketone, polyacrylate, polyetherimide, polyarylsulfone, polyethersulfone, polyamideimide, polyimide, ethylene-tetrafluoroethylene copolymer, tetrafluoroethylene-hexafluoropropylene copolymer, tetrafluoroethylene-hexafluoropropylene-vinylidene fluoride copolymer, or polyvinylidene fluoride, any of which may optionally be heat-stabilized.

5. The barrier film of claim 1, wherein the polymerized acrylate or methacrylate is polymerized tricyclodecanedimethanol diacrylate, triacryloxyethyl isocyanurate, or a combination thereof.

6. The barrier film of claim 1, wherein the siloxane reaction product shares a siloxane bond with the silicon aluminum oxide layer.

7. The barrier film of claim 1, wherein the siloxane reaction product includes an amide bond derived from reaction between an amino group and an acrylate or methacrylate group.

8. A barrier assembly comprising the barrier film of claim 1, wherein a first major surface of the barrier film is adhered to a top sheet with a pressure sensitive adhesive, wherein the top sheet comprises at least one of an ethylene-tetrafluoroethylene copolymer, a tetrafluoroethylene-hexafluoropropylene copolymer, a tetrafluoroethylene-hexafluoropropylene-vinylidene fluoride copolymer, or polyvinylidene fluoride.

9. The barrier assembly of claim 8, wherein a second major surface of the barrier film opposite the first major surface of the barrier film adhered to the top sheet is disposed on a photovoltaic cell.

10. An article incorporating a barrier film according to claim 1, wherein the article is a solid state lighting device, a display device, or a combination thereof.

11. The barrier assembly of claim 9, wherein the photovoltaic cell is a CIGS cell.

12. The barrier assembly of claim 9, wherein the second major surface of the barrier film opposite the first major surface of the barrier film adhered to the top sheet is attached to the photovoltaic cell with an encapsulant.

13. A method of making the barrier film of claim 1, the method comprising:
providing the first polymer layer on the surface of the substrate;
providing the silicon aluminum oxide layer on the first polymer layer; and
providing the second polymer layer on the silicon aluminum oxide layer.

\* \* \* \* \*

UNITED STATES PATENT AND TRADEMARK OFFICE
CERTIFICATE OF CORRECTION

PATENT NO. : 10,636,920 B2
APPLICATION NO. : 14/420060
DATED : April 28, 2020
INVENTOR(S) : Joe Spagnola Page 1 of 1

It is certified that error appears in the above-identified patent and that said Letters Patent is hereby corrected as shown below:

In the Specification

<u>Column 4</u>
Line 35, after "humidity" insert -- . --.
Line 43, after "requirements" insert -- . --.

<u>Column 11</u>
Line 67, after "sputtering" insert -- . --.

<u>Column 14</u>
Line 25, delete "in$^{-1}$" and insert -- m$^{-1}$ --, therefor.

Signed and Sealed this
First Day of December, 2020

Andrei Iancu
*Director of the United States Patent and Trademark Office*